US010893623B2

(12) United States Patent
David

(10) Patent No.: US 10,893,623 B2
(45) Date of Patent: Jan. 12, 2021

(54) LEAKTIGHT ELECTRONIC DEVICE AND METHOD OF OBTAINING SAME

(71) Applicant: VALEO COMFORT AND DRIVING ASSISTANCE, Créteil (FR)

(72) Inventor: Marc David, Creteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 146 days.

(21) Appl. No.: 16/071,014

(22) PCT Filed: Jan. 19, 2017

(86) PCT No.: PCT/EP2017/051121
§ 371 (c)(1),
(2) Date: Jul. 18, 2018

(87) PCT Pub. No.: WO2017/125516
PCT Pub. Date: Jul. 27, 2017

(65) Prior Publication Data
US 2019/0008061 A1    Jan. 3, 2019

(30) Foreign Application Priority Data
Jan. 19, 2016  (FR) ..................... 16 50419

(51) Int. Cl.
*H05K 5/06*     (2006.01)
*B29C 45/14*    (2006.01)
(Continued)

(52) U.S. Cl.
CPC ....... *H05K 5/065* (2013.01); *B29C 45/14073* (2013.01); *B29C 45/14819* (2013.01);
(Continued)

(58) Field of Classification Search
CPC .... H05K 5/065; H05K 7/20463; H05K 5/064; H05K 5/0052; B29C 45/14073;
(Continued)

(56) References Cited

U.S. PATENT DOCUMENTS 5,514,913 A * 5/1996 Mangiagli ......... B29C 45/14073
257/678
9,339,697 B2 * 5/2016 Luciano, Jr. ....... A63B 37/0003
(Continued)

FOREIGN PATENT DOCUMENTS

EP    0 472 199 A1    2/1992
WO   2014/132973 A1   9/2014

OTHER PUBLICATIONS

International Search Report issued in PCT/EP2017/051121 dated Apr. 11, 2017 (2 pages).
(Continued)

*Primary Examiner* — Dameon E Levi
*Assistant Examiner* — David E Lotter
(74) *Attorney, Agent, or Firm* — Osha Bergman Watanabe & Burton LLP

(57) ABSTRACT

The invention relates to a method for obtaining a leaktight electronic device according to which provision is made for steps consisting in: a) placing an electronic module (3) inside a mould (100), b) holding said electronic module away from the walls (101) of said mould with the aid of holding claws (200) each exhibiting an end which protrudes towards the interior of the mould, c) injecting into said mould a thermoplastic material able to harden so as to form a leaktight shell, said holding claws retracting towards the exterior of the mould during the injection of said thermoplastic material.

10 Claims, 2 Drawing Sheets

(51) Int. Cl.
*H01Q 1/32* (2006.01)
*H01Q 1/40* (2006.01)
*B29K 67/00* (2006.01)
*B29K 309/08* (2006.01)
*B29L 31/34* (2006.01)

(52) U.S. Cl.
CPC ............... *H01Q 1/32* (2013.01); *H01Q 1/40* (2013.01); *B29C 2045/14081* (2013.01); *B29K 2067/006* (2013.01); *B29K 2309/08* (2013.01); *B29L 2031/3456* (2013.01)

(58) Field of Classification Search
CPC .... B29C 45/14819; B29C 2045/14081; H01Q 1/32; H01Q 1/40; B29K 2309/08; B29K 2067/006; B29L 2031/3456
See application file for complete search history.

(56) References Cited

U.S. PATENT DOCUMENTS

| | | | |
|---|---|---|---|
| 9,994,152 B1* | 6/2018 | Hess | G01S 13/584 |
| 2003/0077346 A1* | 4/2003 | Boyer | B29C 44/1266 |
| | | | 425/129.1 |
| 2005/0001767 A1* | 1/2005 | Wulff | B29C 45/14639 |
| | | | 343/700 MS |
| 2013/0194735 A1* | 8/2013 | Kajiya | G02B 6/0095 |
| | | | 361/679.01 |
| 2016/0050776 A1* | 2/2016 | Drysdale | G06F 1/1656 |
| | | | 361/679.01 |

OTHER PUBLICATIONS

Written Opinion of the International Searching Authority issued in PCT/EP2017/051121 dated Apr. 11, 2017 (6 pages).

* cited by examiner

LEAKTIGHT ELECTRONIC DEVICE AND METHOD OF OBTAINING SAME

TECHNICAL FIELD OF THE INVENTION

The present invention relates generally to the field of leaktight devices.

It relates more particularly to a leaktight electronic device and to a method for obtaining such a device.

It relates in particular to a leaktight motor-vehicle antenna for receiving low-frequency waves.

PRIOR ART

It is known practice to use an identifier, typically carried by a user of a vehicle, in order for the vehicle to be able to detect the approach of the user. When the user and the vehicle are sufficiently close together, it is possible to automatically activate a function of the vehicle, such as the unlocking of the vehicle doors.

To this end, provision is made for the identifier to be able to emit an electromagnetic signal and for the vehicle to have a receiver module designed to receive this signal, such that the vehicle and the identifier can communicate with one another.

For this purpose, the signal receiver module which generally comprises an antenna for receiving low-frequency waves and preferably has to be placed on an exterior part of the vehicle, which is sometimes subject to poor climatic conditions, for example bad weather.

However, this receiver module comprises electronic elements which need to be protected from these poor climatic conditions.

SUBJECT OF THE INVENTION

In order to remedy the abovementioned drawback of the prior art, the present invention proposes protecting the antenna for receiving low-frequency waves in a leaktight manner.

More particularly, the invention proposes a method for obtaining a leaktight electronic device, in which the following steps are provided:

a) placing an electronic module inside a mold, b) keeping said electronic module away from the walls of said mold with the aid of holding lugs that each have an end which protrudes toward the inside of the mold, c) injecting into said mold a thermoplastic material designed to harden so as to form a leaktight shell, said holding lugs retracting toward the outside of the mold during the injection of said thermoplastic material.

Advantageously, since the holding lugs are designed to retract toward the outside of the mold, the thermoplastic material entirely surrounds the electronic module, including in the place of the lugs keeping it away from the mold walls.

Moreover, this method is easy to implement.

Further nonlimiting and advantageous features of the above-described method are as follows:

at least one electronic subassembly of the electronic module placed inside the mold in step a) is encapsulated in a flexible shell;

said flexible shell deforms while said thermoplastic material hardens;

the electronic module comprises an antenna and/or at least one electronic circuit;

in step b), said electronic module is gripped between at least two holding lugs positioned on either side of said electronic module;

in step b), said end of each holding lug that protrudes toward the inside of the mold has a beveled portion facing at least one inlet through which the thermoplastic material is injected in step c), such that the thermoplastic material injected exerts a pressure force on said beveled end in order to retract the holding lug;

each holding lug is mounted in said mold by means of a spring such that, in step b), said end of the holding lug protrudes toward the inside of said mold and, in step c), said end can retract, in particular on account of the injection of said thermoplastic material.

The invention also proposes a leaktight electronic device comprising:

an electronic module having an electronic subassembly encapsulated in a flexible shell, and a rigid leaktight shell surrounding said electronic module.

Nonlimiting and advantageous features of this device are as follows:

the rigid leaktight shell comprises a main body and a head integral with said body such that said leaktight electronic device is in one piece;

the leaktight shell comprises an opening through which there projects a connection pin electrically connected to said electronic module;

the leaktight electronic device is designed to be positioned on an exterior element of a motor vehicle in order to form an antenna for receiving low-frequency waves.

DETAILED DESCRIPTION OF AN EXEMPLARY EMBODIMENT

The description which follows with reference to the appended drawings, which are given by way of nonlimiting examples, will make it easy to understand what the invention consists of and how it can be achieved.

Figure 1:
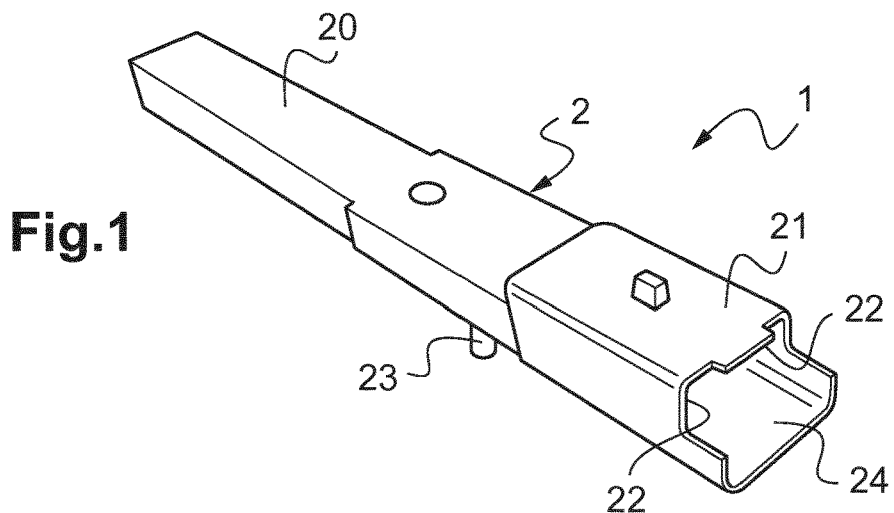
FIG. 1 is a schematic three-quarters front depiction of a leaktight electronic device according to the invention.
Figure 2:
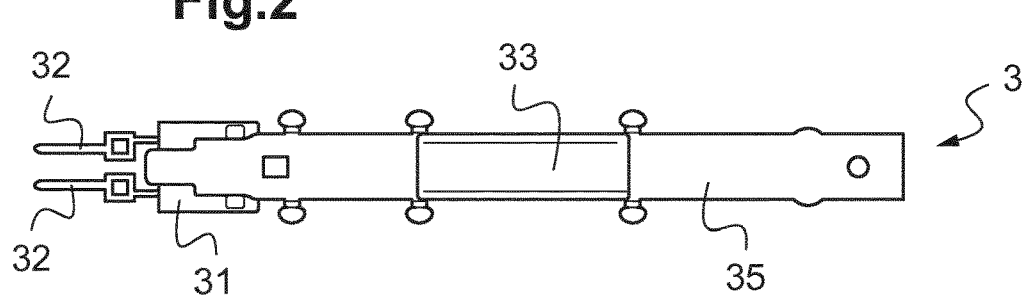
FIG. 2 is a schematic top-view depiction of an electronic module comprised in the electronic device in FIG. 1.

FIG. 1 shows a leaktight electronic device 1 comprising a rigid leaktight shell 2 formed around an electronic module 3 (visible in FIG. 2).

In practice, this leaktight electronic device 1 is designed to be positioned on an exterior element of a motor vehicle in order to form an antenna for receiving low-frequency waves.

The range of low frequencies in question is in this case in the region of 125 kHz±3 kHz.

The low-frequency waves are generated by an identifier carried by a user. When the identifier gets sufficiently close to the leaktight electronic device, the antenna formed thereby receives said low-frequency waves, initiating a function of said vehicle, for example the unlocking of the doors of the vehicle, after processing of the signal carried by these low-frequency waves and, optionally, subsequent exchanges.

More specifically, the leaktight shell 2 of the leaktight electronic device 1 is made of a thermoplastic material, that is to say a polymer material the mechanical properties of which, of the elasticity type, change with temperature. The thermoplastic material is designed to be liquid at temperatures above its glass transition temperature, and designed to harden at temperatures below its glass transition temperature. In other words, the thermoplastic material hardens by cooling. Thus, advantageously, the thermoplastic material is quite suitable for use in molding methods.

In this case, the thermoplastic material is chosen to have a glass transition temperature in the region of 60° C.

The thermoplastic material is particularly rigid below 60° C. It is moreover leaktight once it has hardened, that is to say impermeable to water such that, once the leaktight electronic device 1 has been mounted on the motor vehicle, the electronic module that it encloses never comes into contact with water.

The thermoplastic material used here is a polybutadiene terephthalate reinforced by around 30% by weight, with respect to the total weight of the thermoplastic material, with glass fibers. This thermoplastic material is better known under the name PBT-GF30.

In practice, and as will be explained in more detail below, the leaktight shell 2 is formed around the electronic module 3, by molding this thermoplastic material (see FIG. 4).

Figure 4:
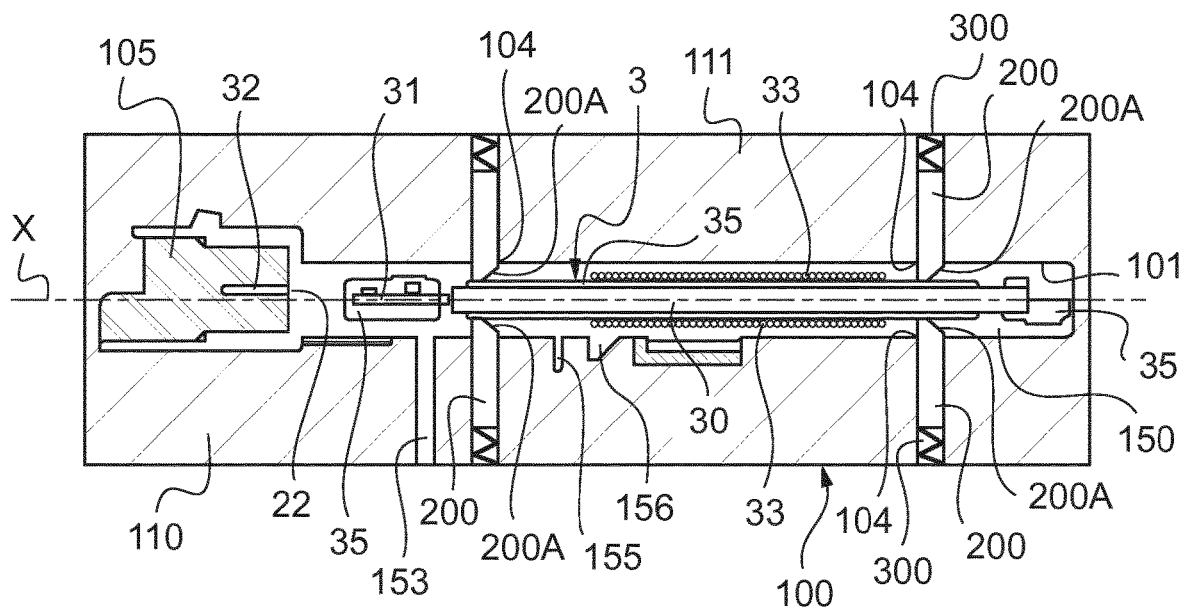
FIG. 4 is a schematic depiction in longitudinal section on the plane IV-IV of the mold in FIG. 3 containing the electronic module in FIG. 2.
Figure 5:
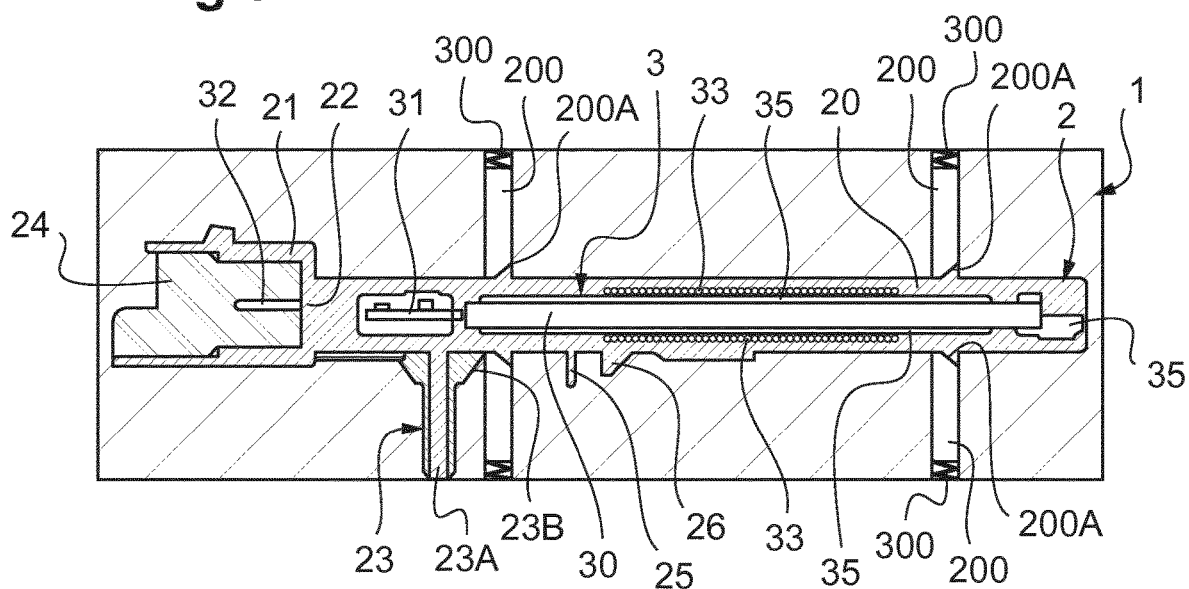
FIG. 5 is a schematic depiction on the section plane IV-IV of the leaktight electronic device of the invention following implementation of the method in the mold in FIG. 3.

As FIGS. 1, 4 and 5 show, the rigid leaktight shell 2 comprises a main body 20 and a head 21 integral with said body 20 such that the leaktight electronic device 1 is in one piece.

In other words, in this case, the body 20 and the head 21 of the leaktight shell 2 form a single part.

The body 20 extends generally in a main direction of extension X, and one of the ends of the body is extended by the head 21.

The head 21 extends in the same direction of extension X but over a shorter distance.

The body 20 is solid, i.e., on passing through it from one side to the other, material is always found.

By contrast, the head 21 is hollow and comprises four side walls which open onto an access opening 24.

In this case, the access opening 24 is situated at one of the overall ends of the leaktight electronic device 1. It allows the leaktight electronic device 1 to be electrically connected to an exterior electronic unit, while ensuring the leaktightness of said leaktight electronic device 1.

For this connecting purpose, the head 21 of the leaktight shell 2 comprises an opening 22 through which there projects a connection pin 32 electrically connected to the electronic module 3 enclosed in the leaktight shell 2 (see FIGS. 4 and 5).

In this case, the leaktight shell 2 has two openings 22 through which there project two connection pins 32 electrically connected to said electronic module 3.

Furthermore, a fastening lug 23 for fastening said leaktight electronic device 1 to an exterior element of the motor vehicle is provided on the leaktight shell 2.

In practice, the leaktight electronic device 1 is fastened to the rear bumper of said motor vehicle.

The fastening lug 23 extends from the main body 20 in an overall direction perpendicular to the direction of extension of said body 20.

It has a relatively long cylindrical central portion 23A around which a star-shaped flange 23B is formed (see FIG. 5).

Also provided on the leaktight shell 2 are two support lugs 25, 26 for supporting the leaktight electronic device 1 on the motor vehicle.

These support lugs 25, 26 also extend in an overall direction perpendicular to the direction of extension of the body.

The electronic module 3 enclosed in the body 20 of the leaktight shell 2 extends in the same direction of extension X as that of said body 20 (see FIGS. 4 and 5). Visually, said electronic module 3 forms a central core of said body 20.

In this case, this electronic module 3 comprises an antenna and at least one electronic circuit 31 (see FIG. 2).

The electronic circuit 31 is a printed circuit to which said connection pins 32 and the antenna are connected.

In practice, the connection pins 32 make it possible to supply the electronic circuit 31 with electricity from a power source outside said leaktight electronic device 1; when the latter is in position on the motor vehicle.

The antenna comprises a material having magnetic properties that is surrounded at least partially by a metal coil 33.

More specifically, it is formed in this case by a ferrite parallelepiped 30 partially surrounded by a copper coil 33 designed to interact with this ferrite element 30.

The ferrite element 30 of the antenna and the electronic circuit 31 forms an electronic subassembly of the electronic module 3.

Advantageously, the electronic subassembly of the electronic module 3 is encapsulated in a flexible shell 35.

The flexible shell 35 is made of a polyamide thermoplastic material. This material is very flexible and so, at temperatures greater than or equal to ambient temperature, it is designed to deform easily under stress. The polyamide material used here is Macromelt®.

Thus, the flexible shell 35 is designed to protect the more fragile elements of the electronic module 3, i.e. in this case the ferrite element 30 of the antenna and the electronic circuit 31, during the formation of the leaktight shell 2 during the method for manufacturing the leaktight electronic device 1.

Specifically, this flexible shell 35 is designed to deform when it undergoes stresses associated with the hardening of the thermosetting material. The electronic subassembly of the electronic module 3 is then protected during this hardening.

In practice, a copper wire is wound around a portion of the flexible shell 35 so as to form the coil 33 of the antenna.

In summary, the electronic module 3 forms the heart of the leaktight electronic device 1. The electronic subassembly of the electronic module 3 is encapsulated in a flexible shell 35 which protects it, this flexible shell 35 is itself partially surrounded by the copper coil 33 designed to interact with the ferrite element 30 in order to form the antenna, and the electronic module 3 thus formed is enclosed in a rigid leaktight shell 2.

The following part explains in detail the method implemented in order to obtain such a leaktight electronic device 1.

Notably, according to this method, the following steps are provided:

a) placing the electronic module 3 inside a mold 100, b) keeping said electronic module 3 away from the walls 101 of said mold 100 with the aid of holding lugs 200 that each have an end 201 which protrudes toward the inside of the mold 100, c) injecting into said mold 100 the thermoplastic material designed to harden so as to form the leaktight shell 2, said holding lugs 200 retracting toward the outside of the mold 100 during the injection of the thermoplastic material, in this case on account of the injection of said thermoplastic material.

Advantageously, in step a), the electronic module 3 is already encapsulated in the above-described flexible shell 35.

In other words, before it is inserted into the mold 100, the electronic module 3 is already ready to be brought into contact with the thermoplastic material in step c).

In other words, the electronic subassembly of the electronic module 3 is already encapsulated in the above-described flexible shell 35, and a portion of this flexible shell 35 already holds the copper coil 33 of the antenna.

To this end, it is conceivable for a step of encapsulating the electronic subassembly of the electronic module 3 in said flexible shell 35 to be provided before step a).

Alternatively, it may be conceivable to obtain the electronic subassembly of the electronic module in an already encapsulated form before implementing step a) of the method.

Advantageously, said flexible shell 35 is designed to deform during the hardening of the thermoplastic material (for example in step c) or after step c)).

Advantageously, in step a), the electronic module 3 is already ready to be brought into contact with the thermoplastic material in step c).

Once the electronic subassembly of the electronic module 3 has been encapsulated in the flexible shell 35, the coil 33 is created around said flexible shell 35.

To this end, a copper wire is wound around a portion of the flexible shell 35 at least partially enclosing the ferrite element 30 of the antenna (see FIG. 2).

Figure 3:
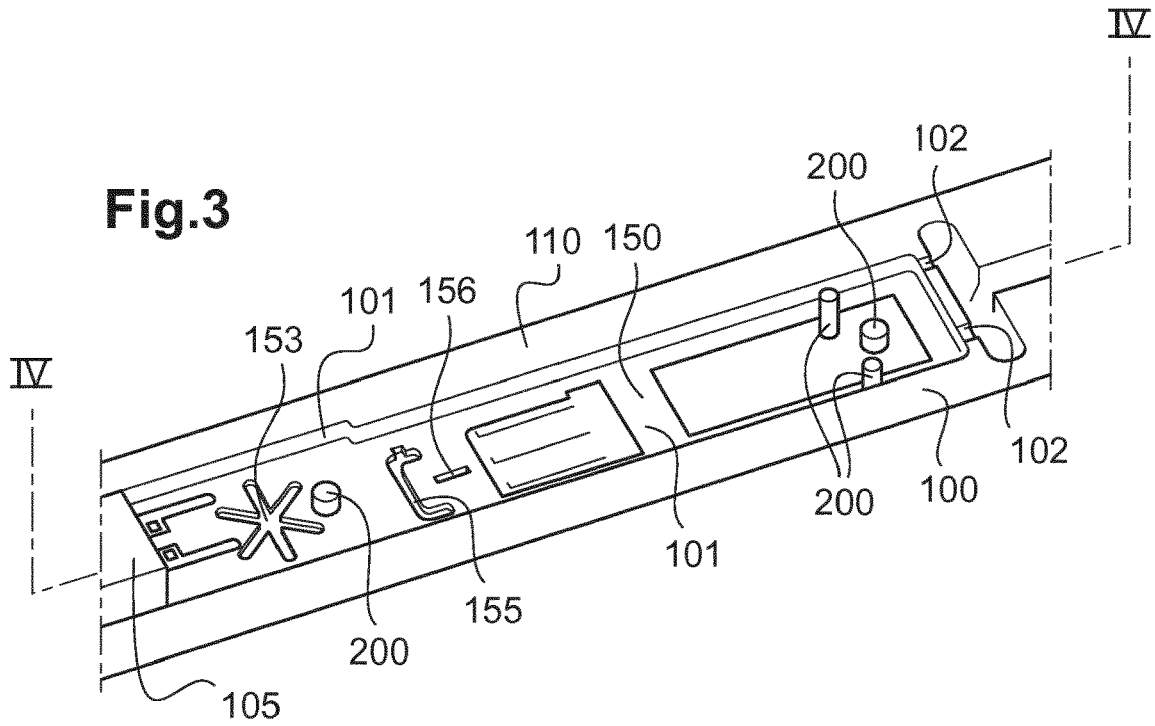
FIG. 3 is a schematic top-view depiction of a portion of a mold designed to implement the invention.

FIGS. 3 to 5 show the mold 100 designed for implementing this method.

In FIG. 5, only the leaktight electronic device 1 obtained at the end of the method and the holding lugs 200 are referenced, the rest of the mold 100 being identical to that shown in FIG. 4.

As FIG. 4 shows, the mold 100 comprises a bottom 110 and a top 111 that are designed to be positioned one above the other so as to form the mold 100.

In step a), the electronic module 3 is placed in the bottom 110 of the mold 100, and the top 111 is positioned on top so as to close the mold 100.

When the bottom 110 and the top 111 of the mold 100 are positioned one above the other, the mold 100 is closed and then has walls 101 delimiting a cavity 150. Although not strictly correct, the cavity 150 can then be said to form the interior of the mold 100.

This cavity 150 in this case has a parallelepipedal overall shape.

Two inlets 102 are provided at a first end of said cavity 150 and are intended for the injection, in step c), of said thermoplastic material into said cavity 150. This first end is referred to as injection end.

At the other end of the cavity 150, the mold 100 comprises a shaped obstacle 105 around which the head 21 of the leaktight shell 2 of the leaktight electronic device 1 is molded (see FIG. 3). In other words, the obstacle 105 is intended to form the opening 24 in the head 21 of said leaktight shell 2, during step c).

The cavity 150 also has, in the main wall 101 of the bottom 110 of the mold 100, three depressions 153, 155, 156 that are intended to receive the thermoplastic material during step c) of the method in order to form the fastening lug 23 and the support lugs 25, 26 of said leaktight electronic device 1 (see FIGS. 3 and 4), respectively.

Furthermore, the main walls 101 of the bottom 110 and of the top 111 of the mold 100 have through-openings 104 that are intended to be passed through by the holding lugs 200 in step b) of the method (see FIG. 4).

More specifically, these main walls 101 of the bottom 110 and of the top 111 of the mold 100, which face one another, each comprise at least one through-opening 104 (see FIG. 4).

In this case, the main wall 101 of the bottom 110 of the mold 100 comprises four through-openings and the main wall 101 of the top 111 of the mold 100 also comprises four through-openings facing those in said main wall 101 of the bottom 110 of the mold 100.

On each of these main walls 101, two through-openings 104 are aligned along a central longitudinal axis of the mold 100, and two through-openings 104 are aligned along a transverse axis of the mold 100, close to the injection end of the cavity 150.

Each holding lug 200 passes through one of the through-openings 104 in the mold 100.

More specifically, in step b), the end of each holding lug 200 protrudes into the interior of the mold 100, that is to say into the cavity 150.

To this end, each holding lug 200 is mounted in said mold 100 by means of a spring 300, such that, when said spring 300 is at rest, namely when it is not tensioned, the holding lug 200 forms a protuberance in the interior of the mold 100.

As shown in FIG. 4, the spring 300 is interposed between the corresponding holding lug 200 and the mold 100.

Thus, by virtue of the position of the through-openings that face one another in pairs, in step b), said electronic module 3 is gripped between at least two holding lugs 200 positioned on either side of said electronic module 3.

These two holding lugs 200 form a pair of holding lugs 200 gripping said electronic module 3.

In this case, the electronic module 3 is gripped between eight holding lugs 200, i.e. four pairs of holding lugs 200.

The electronic module 3 is kept away from the walls 101 of said mold 100 (see FIG. 4) by virtue of these holding lugs 200.

Moreover, advantageously, the two pairs of longitudinally aligned holding lugs 200 prevent the electronic module 3 from rocking longitudinally, i.e. they prevent the electronic circuit 31, for the one part, and the end of the antenna, for the other part, from moving toward the main walls 101 of the mold 100, notably during the injection of the thermoplastic material.

Similarly, the two pairs of transversely aligned holding lugs 200 prevent the electronic module 3 from rocking transversely, i.e. they prevent the electronic module 3 from rotating about the central longitudinal axis of the mold 100, notably during the injection of the thermoplastic material.

Furthermore, advantageously, it is possible to compress the spring 300 on which each holding lug 200 is mounted, so as to push said holding lug 200 back toward the exterior of the mold 100, that is to say out of the cavity 150, in order that it be flush with the corresponding main wall 101 of the mold 100.

Notably, the material injected in step c) compresses these springs 300.

Thus, each holding lug 200 is able to move in translation in the direction of compression of the spring 300 on which it is mounted, between a rest position in which it projects into the interior of the mold 100 (FIG. 4) and a retracted position in which it is flush with the corresponding main wall 101 of the mold 100 (FIG. 5).

During step c) of the method, the holding lugs 200 retract under the effect of the injection of the thermoplastic material, which exerts a pressure force on said holding lugs 200 in order to push them back out of the cavity 150.

In order to facilitate the retraction of the holding lugs 200 under the effect of the injection of the thermoplastic material, said end 200A of each holding lug projecting toward the interior of the mold 100 has a beveled portion 200A.

Each beveled portion 200A faces one of the inlets 102 through which the thermoplastic material is injected in step c), such that the thermoplastic material can exert a pushing force in the direction of compression of the spring 300 associated with the holding lug 200.

Alternatively, it may be conceivable for each holding lug to be mounted in a pivoting manner in the mold.

In this variant, each holding lug would be mounted in the mold by way of a rotary pin such that, in step c), it would be forced to retract by pivoting about this rotary pin.

Thus, in this variant, each holding lug would be rotatable about its rotary pin between a rest position in which it would project into the interior of the mold, and a retracted position in which it would be flush with the wall of the mold.

During the injection of the thermoplastic material, said thermoplastic material would exert a pressure force on the beveled portion, and this would cause the holding lug to pivot about its rotary pin.

In a further variant, provision may be made for each holding lug to be retracted by active mechanical means during injection (and not simply on account of the forces generated by the material injected into the mold, as described above). Such active mechanical means could be programmed to act synchronously with respect to the injection of material.

Furthermore, regardless of the variant embodiment envisioned, when the thermoplastic material injected has hardened sufficiently to form the leaktight shell 2 of the leaktight electronic device 1, the bottom 110 and the top 111 of the mold 100 are separated so as to access the interior of the mold 100 and extract said leaktight electronic device 1 therefrom.

The invention claimed is:

1. A method for obtaining a leaktight electronic device, comprising:
    a) placing an electronic module inside a mold;
    b) keeping said electronic module away from the walls of said mold with the aid of holding lugs that each have an end which protrudes toward the inside of the mold;
    c) injecting into said mold a thermoplastic material designed to harden so as to form a leaktight shell, said holding lugs retracting toward the outside of the mold during the injection of said thermoplastic material,
    wherein at least one electronic subassembly of the electronic module placed inside the mold in step a) is encapsulated in a flexible shell, and
    wherein said flexible shell deforms while said thermoplastic material hardens.

2. The method as claimed in claim 1, wherein the electronic module comprises an antenna.

3. The method as claimed in claim 1, wherein the electronic module comprises at least one electronic circuit.

4. The method as claimed in claim 1, wherein, in step b), said electronic module is gripped between at least two holding lugs positioned on either side of said electronic module.

5. The method as claimed in claim 1, wherein, in step b), said end of each holding lug that protrudes toward the inside of the mold has a beveled portion facing at least one inlet through which the thermoplastic material is injected in step c), such that the thermoplastic material injected exerts a pressure force on said beveled end in order to retract the holding lug.

6. The method as claimed in claim 1, wherein each holding lug is mounted in said mold by a spring such that, in step b), said end of the holding lug protrudes toward the inside of said mold and, in step c), said end can retract.

7. A leaktight electronic device comprising:
    an electronic module having an electronic subassembly encapsulated in a flexible shell; and
    a rigid leaktight shell surrounding said electronic module, obtained by placing and positioning the electronic module inside a mold such that the electronic module is held away from walls of the mold by holding lugs that each have an end which protrudes toward the inside of the mold,
    wherein a thermoplastic material that is configured to harden is injected into the mold so as to form the rigid leaktight shell,
    wherein said holding lugs retract toward the outside of the mold during injection of said thermoplastic material, and
    wherein said flexible shell deforms while said thermoplastic material hardens.

8. The leaktight electronic device as claimed in claim 7, wherein the rigid leaktight shell comprises a main body and a head integral with said body such that said leaktight electronic device is in one piece.

9. The leaktight electronic device as claimed in claim 7, wherein the leaktight shell comprises an opening through which there projects a connection pin electrically connected to said electronic module.

10. The leaktight electronic device as claimed in claim 7, which is positioned on an exterior element of a motor vehicle in order to form an antenna for receiving low-frequency waves.

* * * * *